(12) United States Patent
Ong

(10) Patent No.: US 8,077,508 B1
(45) Date of Patent: Dec. 13, 2011

(54) DYNAMIC MULTISTATE MEMORY WRITE DRIVER

(75) Inventor: Adrian E. Ong, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 285 days.

(21) Appl. No.: 12/544,189

(22) Filed: Aug. 19, 2009

(51) Int. Cl.
*G11C 11/14* (2006.01)
(52) U.S. Cl. ......... 365/171; 365/158; 365/173; 365/209
(58) Field of Classification Search ............... 365/171, 365/158, 173, 209
See application file for complete search history.

(56) References Cited

U.S. PATENT DOCUMENTS

| | | |
|---|---|---|
| 6,421,293 B1 | 7/2002 | Candelier et al. |
| 6,552,928 B1 | 4/2003 | Qi et al. |
| 6,590,825 B2 | 7/2003 | Tran et al. |
| 6,842,361 B2 * | 1/2005 | Miyatke et al. ............. 365/145 |
| 7,394,685 B2 * | 7/2008 | Ooishi et al. .................. 365/171 |
| 7,742,329 B2 * | 6/2010 | Yoon et al. .................... 365/158 |
| 7,936,592 B2 | 5/2011 | Wang et al. |
| 2008/0189588 A1 | 8/2008 | Tanaka et al. |
| 2008/0215954 A1 | 9/2008 | Oshikiri |

OTHER PUBLICATIONS

Notice of Allowance for U.S. Appl. No. 12/558,451 mailed on Aug. 11, 2011.

* cited by examiner

*Primary Examiner* — Anh Phung
*Assistant Examiner* — Hai Pham
(74) *Attorney, Agent, or Firm* — Kilpatrick Townsend & Stockton LLP; Ardeshir Tabibi

(57) ABSTRACT

A circuit includes, in part, a multitude of magnetic random access memory cells, one or more column decoders, one or more row decoders, and a write driver circuit. The write driver circuit is responsive to data signal as well as to read/write signals. During writing of a first data to a selected magnetic random access memory cell, the write driver circuit causes the first signal line to be at a second voltage and the second signal line to be at the first voltage. The second voltage is greater than the first voltage. During writing of a second data to the selected magnetic random access memory cell, the write driver circuit cause the first signal line to be at a third voltage and the second signal line to be at the second voltage. The third voltage is smaller than the first voltage.

20 Claims, 8 Drawing Sheets

DYNAMIC MULTISTATE MEMORY WRITE DRIVER

BACKGROUND OF THE INVENTION

The present invention relates to memory integrated circuits, and more particularly to writing of data to a magnetic random access memory.

Semiconductor memory devices have been widely used in electronic systems to store data. There are generally two types of semiconductor memories, including non-volatile and volatile memories. A volatile memory device, such as a Static Random Access Memory (SRAM) or a Dynamic Random Access Memory (DRAM) device, loses its data when the power applied to it is turned off. In contrast, a non-volatile semiconductor memory device, such as a Flash Erasable Programmable Read Only Memory (Flash EPROM) or a magnetic random access memory (MRAM), retains its charge even after the power applied thereto is turned off. Therefore, where loss of data due to power failure or termination is unacceptable, a non-volatile memory is used to store the data FIG. 1A is a simplified cross-sectional view of a magnetic tunnel junction (MTJ) structure 10 used in forming a spin torque transfer (STT) MRAM cell. MTJ 10 is shown as including, in part, a reference layer 12, a tunneling layer 14, and a free layer 16. Reference layer 12 and free layer 16 are ferromagnetic layers. Tunneling layer 14 is a nonmagnetic layer. The direction of magnetization of reference layer 12 is fixed and does not change. The direction of magnetization of free layer 16, however, may be varied by passing a sufficiently large current through the MTJ structure. In FIG. 1A, reference layer 12 and free layer 14 are assumed to have the same magnetization direction, i.e., they are in a parallel state. In FIG. 1B, reference layer 12 and free layer 14 are assumed to have opposite magnetization directions, i.e., they are in an anti-parallel state. In FIG. 1C, reference layer 12 and free layer 14 are assumed to have the same magnetization direction perpendicular to a plane defined by the interface of free layer 16 and tunneling layer 14. In FIG. 1D, reference layer 12 and free layer 14 are assumed to have opposite magnetization directions perpendicular to a plane defined by the interface of free layer 16 and tunneling layer 14.

To switch from the parallel state, as shown in FIG. 1A, to the anti-parallel state, as shown in FIG. 1B, the voltage potential of reference layer 12 is increased relative to that of free layer 16. This voltage difference causes spin polarized electrons flowing from free layer 16 to reference layer 12 to transfer their angular momentum and change the magnetization direction of free layer 16 to the anti-parallel state, as shown in FIG. 1B. To switch from the anti-parallel state to the parallel state, the voltage potential of free layer 16 is increased relative to that of reference layer 12. This voltage difference causes spin polarized electrons flowing from reference layer 16 to free layer 12 to transfer their angular momentum and change the magnetization direction of free layer 16 to the parallel state, as shown in FIG. 1A.

To switch from the parallel state to the non-parallel state or vice versa, the voltage applied to MTJ 10 and the corresponding current flowing through MTJ must be greater than a respective pair of threshold values. The voltage that must exceed a threshold voltage in order for the switching to occur is also referred to as the switching voltage $V_c$. Likewise, the current that must exceed a threshold current in order for the switching to occur is referred to as the switching current $I_c$. As is well known, when free layer 16 and reference layer 12 have the same magnetization direction (parallel state), MTJ 10 has a relatively low resistance. Conversely, when free layer 16 and reference layer 12 have the opposite magnetization direction (anti-parallel state), MTJ 10 has a relatively high resistance. Due to the physical properties of an MTJ, the critical current required to change the state of an MTJ from a parallel to an anti-parallel is often greater than the critical current required to change the state of the MTJ from an anti-parallel to a parallel state.

FIG. 2A shows an MTJ 10 and an associated select transistor 20 together forming an STT-MRAM cell 30. Transistor 20 is often an NMOS transistor due to its inherently higher current drive, lower threshold voltage, and smaller area relative to a PMOS transistor. As is described further below, the current used to write a "1" in MRAM 30 is different than the current used to write a "0". The asymmetry in the direction of current flow during these two write conditions is caused by the asymmetry in the gate-to-source voltage of transistor 20. Accordingly, a write driver circuit adapted to deliver sufficient current to write a "0", may not be able to provide enough current to write a "1". Similarly, a write driver circuit adapted to deliver sufficient current to write a "1" may deliver a current that is greater than what would otherwise be an acceptable current level to write a "0".

In the following description, an MRAM cell is defined as being in a logic "0" state when the free and reference layers of its associated MTJ are in a parallel (P) state, i.e., the MTJ exhibits a low resistance. This low resistance state is also alternatively shown as $R_{low}$ or $R_P$ state Conversely, an MRAM cell is defined as being in a logic "1" state when the free and reference layers of its associated MTJ are in an anti-parallel (AP) state, i.e., the MTJ exhibits a high resistance. This high resistance state is also alternatively shown as $R_{high}$ or $R_{AP}$ state. Furthermore, in the following, it is assumed that the reference layer of the MTJ faces its associated select transistor, as shown in FIG. 2A. Therefore, in accordance with the discussion above, a current flowing along the direction of arrow 35 (the up direction) (i) either causes a switch from the P state to the AP state thus to write a "1", (ii) or stabilizes the previously established AP state of the associated MTJ. Likewise, a current flowing along the direction of arrow 40 (the down direction) (i) either causes a switch from the AP state to the P state thus to write a "0", (ii) or stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 (i) either causes a switch from the AP state to the P, (ii) or stabilizes the previously established P state of the associated MTJ. Likewise, in such embodiments, a current flowing along the direction of arrow 40 (i) either causes a switch from the P state to the AP state, (ii) or stabilizes the previously established AP state. FIG. 2B is a schematic representation of MRAM 30 of FIG. 2A in which MTJ 10 is shown as a storage element whose resistance varies depending on the data stored therein. The MTJ changes its state (i) from P to AP when the current flows along arrow 35, and (ii) from AP to P when the current flows along arrow 40.

As described above, the voltage required to switch an MTJ from an AP sate to a P state, or vice versa, must exceed a critical value $V_c$. The current corresponding to this voltage is referred to as the critical current $I_c$. FIG. 3 represents the variation in the MTJ state (or its resistance) during various write cycles. To transition from the P state (low resistance state) to AP state (high resistance state), a positive voltage of Vc is applied. Once in the AP state, removing the applied voltage does not affect the state of the MTJ. Likewise, to transition from the AP state to the P state, a negative voltage of Vc is applied. Once in the P state, removing the applied voltage does not affect the state of the MTJ. The resistance of the MTJ is $R_{high}$ when it is in AP state and receives no voltage. Likewise, the resistance of the MTJ is $R_{low}$ when it is in P state and receives no voltage.

FIG. 4A shows an MTJ 10 being programmed to switch from an anti-parallel state (i.e., high resistance state, or logic "1" state) to a parallel state so as to store a "0" (i.e., low resistance state, or logic "0" state). It is assumed that MTJ 10 is initially in a logic "1" or AP state. As described above, to store a "0", a current $I_c$ greater than the critical current is caused to flow through transistor 20 in the direction of arrow 40. To achieve this, the source node (SL) of transistor 20 is coupled to the ground potential via a resistive path (not shown), a positive voltage $V_{cc}$ is applied to the gate node (WL or wordline) of transistor 20, and a positive voltage $V_{cc}$ is applied to the drain node (BL or bitline) of transistor 20.

FIG. 5 is an exemplary timing diagram of the voltage levels at nodes WL, SL, SN and BL during write "0" operation, occurring approximately between times 25 ns and 35 ns, and write "1" operation, occurring approximately between times 45 ns and 55 ns, for a conventional MTJ such as MTJ 10 shown in FIGS. 4A and 4B. Supply voltage $V_{cc}$ is assumed to be 1.8 volts. Signal WL as well as signal CS which is a column select signal are shown as having been boosted to a higher Vpp programming voltage of 3.0 volts. During the write "0" operation, the voltages at nodes BL, SL and SN are shown as being approximately equal to 1.43 V, 0.34 V, and 0.88 V respectively. During the write "1" operation, the voltages at nodes BL, SL and SN are shown as being approximately equal to 0.23 V, 1.43 V, and 0.84 V respectively. Although not shown, for this exemplary computer simulation, the currents flowing through the MTJ during write "0" and "1" operations are respectively 121 µA and 99.2 µA.

FIG. 4B shows an MTJ being programmed to switch from a parallel state to an anti-parallel state so as to store a "1". It is assumed that MTJ 10 is initially in a logic "0" or P state. To store a "1", a current $I_c$ greater than the critical current is caused to flow through transistor 20 in the direction of arrow 35. To achieve this, node SL is supplied with the voltage $V_{cc}$ via a resistive path (not shown), node WL is supplied with the voltage $V_{cc}$, and node BL is coupled to the ground potential via a resistive path (not shown). Accordingly, during a write "1" operation, the gate-to-source voltage of transistor 20 is set to $(V_{WL}-V_{SN})$, and the drain-to-source voltage of transistor 20 is set to $(V_{SL}-V_{SN})$.

Because the gate-to-source and drain-to-source voltages of transistor 20 are higher under the conditions described with reference to FIGS. 4A and 5 than they are under the conditions described with reference to FIGS. 4B and 5, the corresponding current flow through the MTJ is higher when attempting to write a logic "0" than a logic "1". Accordingly, the voltages designed to generate the critical current needed to carry out a write "0" operation may not be sufficient to carry out a write "1" operation. An undesirable asymmetry thus exists in the current levels during write "1" and write "0" operations. Consequently, a transistor size selected to provide sufficient current to write a "0" may not provide enough current to write a "1". Alternatively, a larger transistor size selected to provide the required current to write a "1", may result in generation of excessive current when writing a "0". Such as excess current may damage the tunneling layer of the MTJ shown in FIG. 1.

BRIEF SUMMARY OF THE INVENTION

A memory circuit in accordance with one embodiment of the present invention includes, in part, a multitude of magnetic random access memory cells, one or more column decoders, one or more row decoders, and a write driver circuit. Each magnetic random access memory (MRAM) cell further includes a magnetic tunnel junction structure and an associated select transistor. The write driver circuit is responsive to data and read/write signals.

During a memory read operation, the write driver circuit causes a first signal line coupled to a selected MRAM cell to be tristated, and a second signal line coupled to the selected MRAM cell to be at a first voltage. During writing of a data having a first value, the write driver circuit causes the first signal line to be at a second voltage and the second signal line to be at the first voltage. The second voltage is greater than the first voltage. During writing of a data having a second value, the write driver circuit cause the first signal line to be at a third voltage and the second signal line to be at the second voltage. The third voltage is smaller than the first voltage.

A method of controlling the operation of a memory having disposed therein one or more arrays of MRAM cells includes, in part, selecting at least one of the MRAM cells, causing a first signal line coupled to the selected MRAM cell to be tristated during a read operation, causing a second signal line coupled to the selected MRAM cell to be at a first voltage during the read operation, causing the first signal line to be at a second voltage during a first write operation, causing the second signal line to be at the first voltage during the first write operation, causing the first signal line to be at a third voltage during a second write operation, and causing the second signal line to be at the second voltage during the second write operation. The third voltage is smaller than the first voltage. The second voltage is greater than the first voltage

DETAILED DESCRIPTION OF THE INVENTION

In accordance with one embodiment of the present invention, the voltages applied to the terminals of a magnetic random access memory (MRAM) cell disposed in an array are varied in accordance with the data being written to the MRAM cell. Accordingly, the current used to change the state of the MRAM cell from parallel to anti-parallel and the current used to change the state of the MRAM cell from parallel to anti-parallel are independently controlled to achieve symmetry between these currents during write "0" and write "1" operations. The following description is provided with reference to a write driver circuit that changes the voltage applied to the source terminal of an associated select transistor disposed in each MRAM cell. It is understood, however, that embodiments of the present invention, may also be used to vary the voltage applied to drain, as well as to the voltages applied to both the drain and source regions of such a select transistor.

Figure 6:
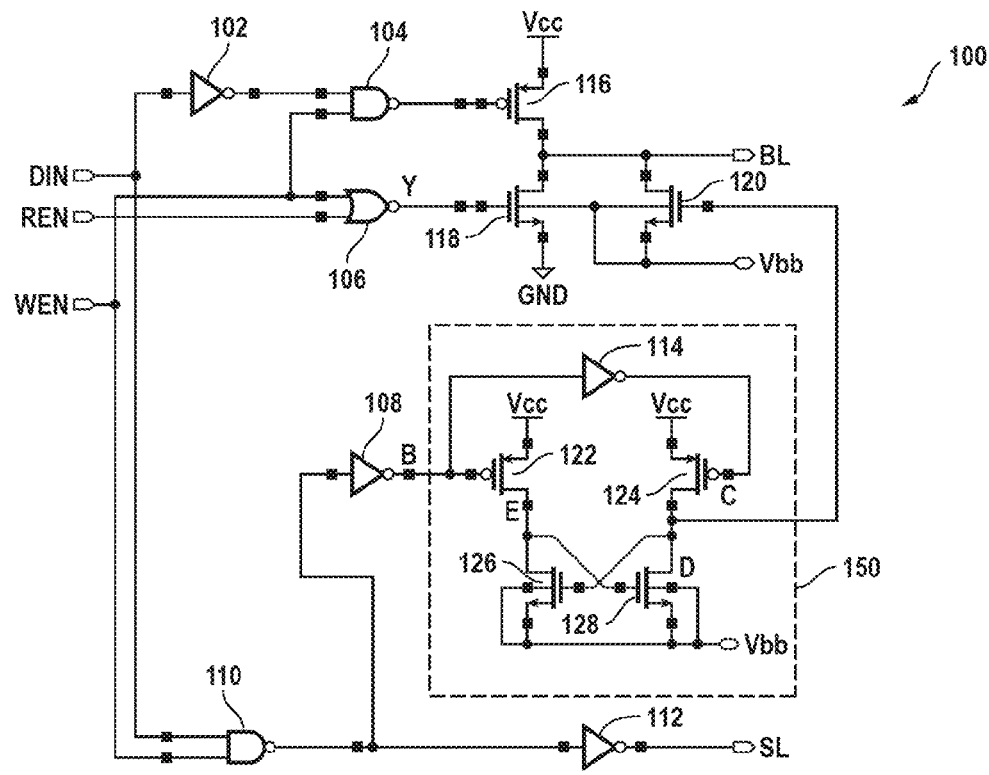
FIG. 6 is a schematic diagram of a write driver circuit in accordance with one embodiment of the present invention.

FIG. 6 is a schematic diagram of a write driver circuit 100 in accordance with one exemplary embodiment of the present invention. Write driver circuit (alternatively referred to herein as driver) 100 is shown as including logic inverters 102, 108, 112, 114, NAND gates 104, 110, NOR gate 106, and transistors 116, 118, 120, 122, 124, 126 and 128. Driver 100 is adapted to receive input signals DIN, WEN, and REN, and in response generate output signals BL and SL. Driver 100 receives supply voltages Vcc, Vbb as well as the ground potential.

During a read operation, signal REN is asserted and signal WEN is deasserted. In the embodiment shown in FIG. 6, a signal is asserted when receiving a high logic level corresponding to the voltage Vcc, and deasserted when receiving a low logic level corresponding to the ground potential. It is understood that in other embodiments, a signal may be asserted when receiving a low logic level, and deasserted when receiving a high logic level. The assertion of signal REN causes the output signal of NOR gate 106 to go low (low logic level) thereby causing transistor 118 to be off. The deassertion of signal WEN causes the output signals of NAND gate 104 and 110 to be high. The high output signal of NAND gate 104 causes transistor 104 to be off. The high output signal of NAND gate 110 causes the output signals of inverters 108, 112, i.e., the signals at nodes SL and B respectively, to be low. The low level of the signal at node B causes the signal at node C to go high via inverter 114. Accordingly, transistor 122 is turned on and transistor 124 is turned off. This enables node E to charge to Vcc and turn on transistor 128, thereby pulling node D to supply voltage Vbb. Because the gate and source regions of transistor 120 are at voltage Vbb, transistor 120 is also off. Accordingly, because during a read operation transistors 116, 118 and 120 are off, node BL is at a high impedance state thus enabling node BL to be controlled by the data stored in a magnetic random access memory coupled thereto.

Figure 7A:
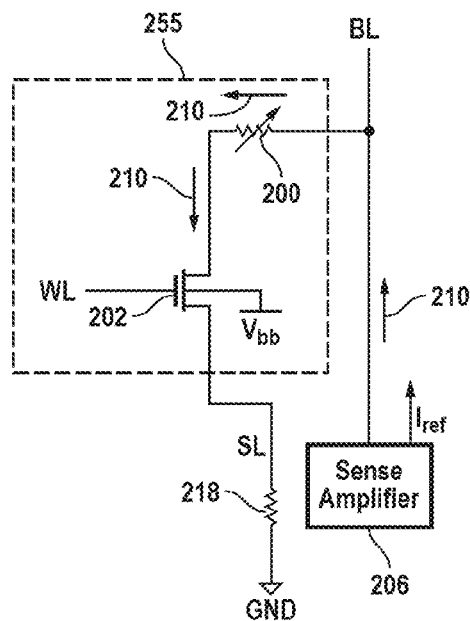
FIG. 7A is a schematic diagram of a magnetic random access memory cell coupled to the write driver circuit of FIG. 6 during a memory read operation, in accordance with one embodiment of the present invention.

FIG. 7A is a schematic diagram of a magnetic random access memory (MRAM) 255 receiving the voltages generated by driver circuit 100 during a memory read operation, in accordance with one embodiment of the present invention. MRAM 255 is shown as including a magnetic tunnel junction (MTJ) structure 200 and an associated select transistor 202. Although in the embodiments described below, select transistor 202 is shown as being an NMOS transistor, it is understood that in other embodiments, select transistor 202 may be a PMOS transistor. During the read operation (i) node WL that is coupled to the gate terminal of transistor 202 is shown as receiving supply voltage Vcc; (ii) node SL coupled to a first current carrying terminal (source or drain) terminal of transistor 202 receives the ground potential via a resistive path generally shown using resistive element 218; (iii) and node BL, which is placed in a high-impedance state (tristated) by driver circuit 100, is driven and controlled by MRAM 255, thus enabling current to flow in the direction of arrow 210. Conventional current sensing circuits such as sense amplifier 206 may be used to determine whether the data stored in the MTJ corresponds to a "0" or "1". A reference current $I_{ref}$ corresponding to an average of a current representing a stored "1" and a current representing a stored "0" may be used for comparison with the current supplied by MRAM 255 to enable sensing by sense amplifier 206. As is shown, the body terminal of transistor 202 is coupled to supply voltage Vbb during a read operation.

Referring to FIG. 6, to write a "0" in an MRAM, signal REN is deasserted and signal WEN is asserted. Signal DIN that represents the data to be stored in the MRAM is set to a low logic level. Accordingly, NAND gate 104 generates a low logic level, in turn causing transistor 116 to be on to charge the voltage at node BL to Vcc. Because the output of NOR gate 106 is low, transistor 118 is off. The high output signal of NAND gate 110 causes the output signals of inverters 108, 112, i.e., the signals at nodes SL and B, to be low. The low level of the signal at node B causes the signal at node C to go high via inverter 114. Accordingly, transistor 122 is turned on and transistor 124 is turned off. This enables node E to charge to Vcc and turn on transistor 128, thereby pulling node D to supply voltage Vbb. Because the gate and source regions of transistor 120 are at voltage Vbb, transistor 120 is also off. Moreover, because the output of NOR gate 106 is low, transistor 118 is off. Therefore, because during a write "0" operation transistors 116 is on while transistors 118 and 120 are off, node BL is pulled to voltage Vcc.

Figure 7B:
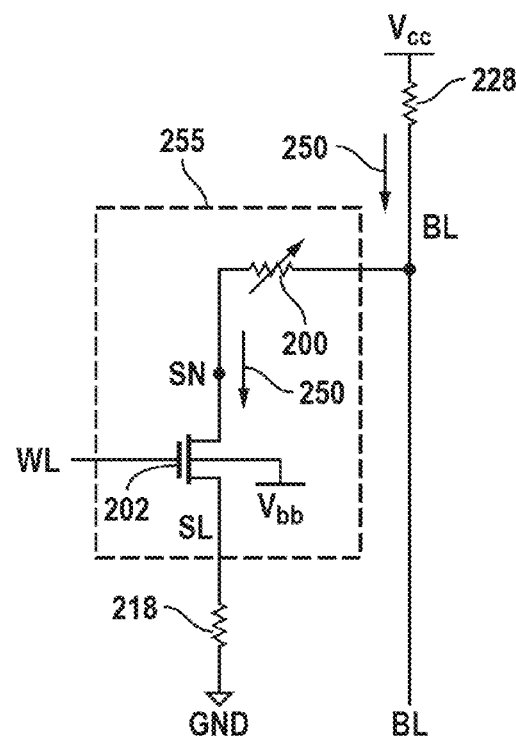
FIG. 7B is a schematic diagram of a magnetic random access memory cell coupled to the write driver circuit of FIG. 6 during a write "0" operation, in accordance with one embodiment of the present invention.

FIG. 7B is a schematic diagram of MRAM 255 receiving the voltages generated by driver circuit 100 during a write "0" operation, in accordance with one embodiment of the present invention. During such a write operation (i) node WL coupled to the gate terminal of transistor 202 is shown as receiving supply voltage Vcc; (ii) node SL coupled to the source/drain terminal of transistor 202 receives the ground potential via a resistive path generally shown using resistive element 218; and (iii) and node BL is pulled to voltage Vcc voltage via a resistive path, generally shown using resistor 228. The body terminal of transistor 202 is coupled to supply voltage Vbb.

Referring to FIG. 6, to write a "1" in an MRAM, signal REN is deasserted and signal WEN is asserted. Signal DIN that represents the data to be stored in the MRAM is set to a high logic level. Accordingly, NAND gate 104 generates a high logic level, in turn causing transistor 116 to be off. Because the output of NOR gate 106 is low, transistor 118 is also off. The low output signal of NAND gate 110 causes the output signals of inverters 108, 112, i.e., the signals at nodes SL and B, to be high. Therefore, the signal at node SL is pulled to voltage Vcc. The high level of the signal at node B causes transistor 12 to be off and transistor 124 to be on. Therefore node D is charged to voltage Vcc, in turn causing node E to be discharged to voltage Vbb via transistor 126. Because the gate and source regions of transistor 120 are at Vcc and Vbb respectively (voltage Vbb is set to a voltage less than the ground potential), node BL is also discharged to voltage Vbb. Therefore, during a write "1" operation, node SL is charged to voltage Vcc and node BL is discharged to voltage Vbb.

Figure 7C:
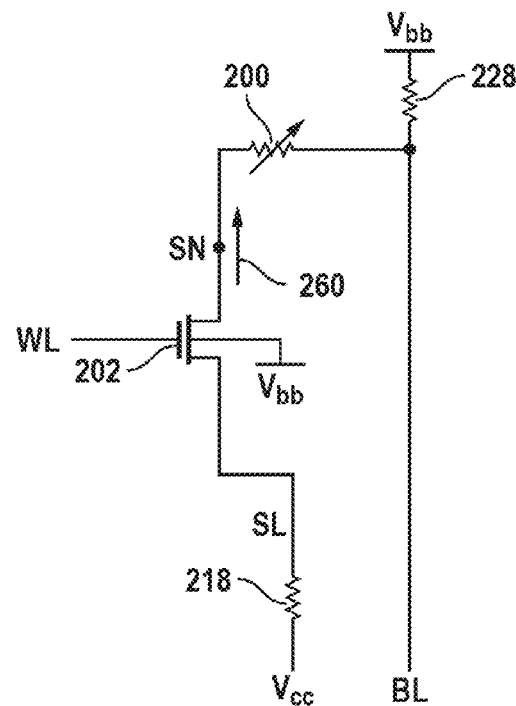
FIG. 7C is a schematic diagram of a magnetic random access memory cell coupled to the write driver circuit of FIG. 6 during a write "1" operation, in accordance with one embodiment of the present invention.

FIG. 7C is a schematic diagram of MRAM 255 receiving the voltages generated by driver circuit 100 during a write "1" operation, in accordance with one embodiment of the present invention. During such a write operation (i) node WL coupled to the gate terminal of transistor 202 is shown as receiving supply voltage Vcc; (ii) node SL coupled to the source/drain terminal of transistor 202 receives voltage Vcc via a resistive path generally shown using resistive element 218; and (iii) and node BL is pulled to voltage Vbb voltage via a resistive path, generally shown using resistor 228. The body terminal of transistor 202 is coupled to supply voltage Vbb.

Referring to FIG. 6, to turn off transistor 120, node D is supplied with voltage Vbb so that the gate-to-source voltage of transistor 120 is substantially set equal to 0. Transistors 122, 124, 126 and 128 together with inverter 114 collectively form a voltage level shifter 150 that shifts the ground voltage to Vbb during read and write "0" cycles. During a write "1" cycle, level shifter 150 supplies voltage Vcc, as described above.

Figure 8A:
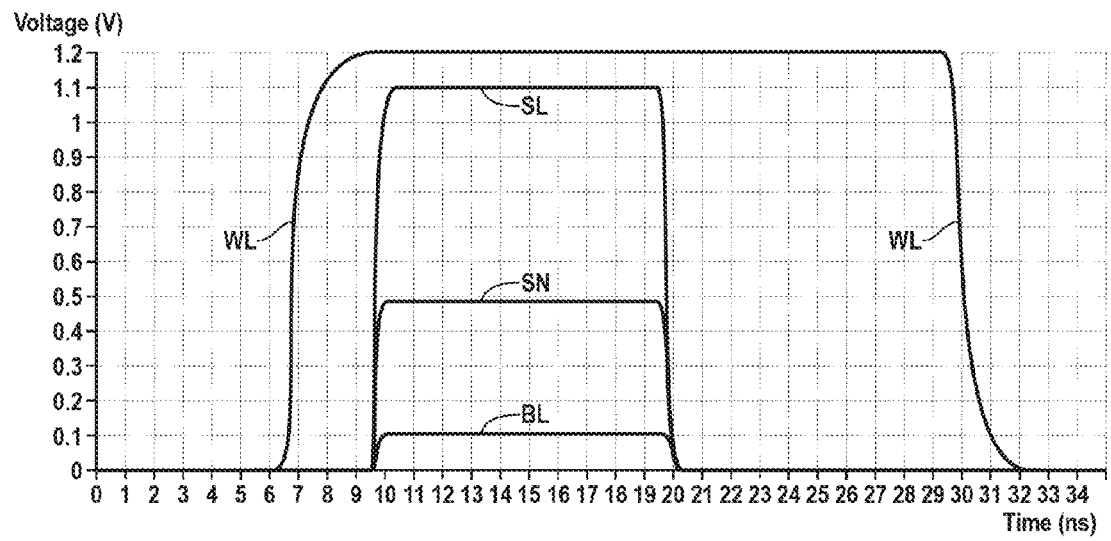
FIGS. 8A-8B are exemplary timing diagrams of a number of signals associated with a magnetic random access memory when coupled to the write driver circuit of FIG. 6 during write "1" operations.
Figure 8B:
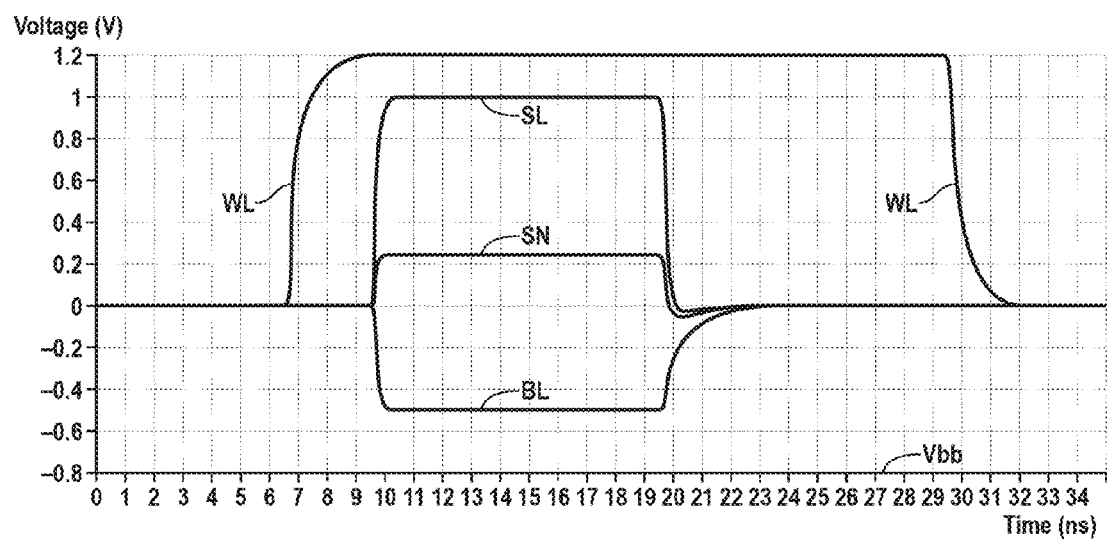

FIG. 8A is an exemplary timing diagram of the voltage signals at nodes WL, BL, SL and SN of MRAM 250 of FIG. 7C during a write "1" operation when Vcc is selected to be 1.2 volts and Vbb is selected to be 0 volt. As is seen from FIG. 8A, the gate-to-source and drain-to-source voltages of transistor 202 are approximately equal to 0.7 and 0.6 volts. FIG. 8B is an exemplary timing diagram of the voltage signals at nodes WL, BL, SL and SN of MRAM 250 of FIG. 7C during a write "1" operation when Vcc is selected to be 1.2 volts and Vbb is selected to be −0.8 volt. As is seen from FIG. 8B, the gate-to-source and drain-to-source voltages of transistor 202 are approximately equal to 1.0 and 0.8 volts thus causing transistor 202 to generate a higher current, in accordance with embodiments of the present invention.

Figure 9A:
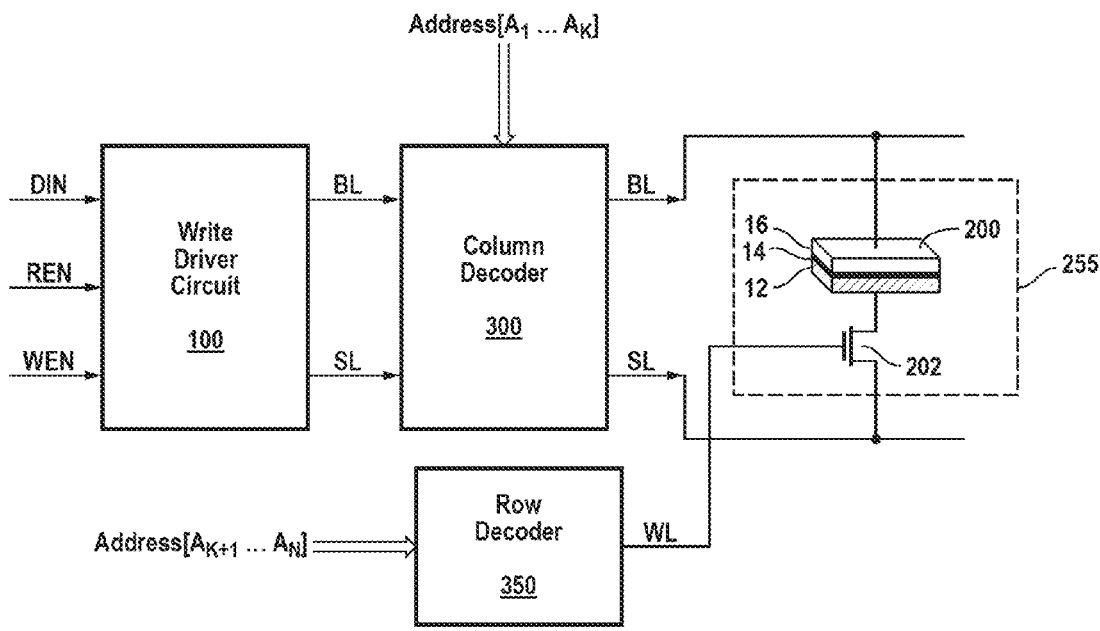
FIG. 9A shows a magnetic random access memory having a magnetic tunnel junction structure whose reference layer faces its associated select transistor while coupled to the word driver circuit of FIG. 6, in accordance with one embodiment of the present invention.

FIG. 9A shows an MRAM 255 coupled to nodes BL and SL of write driver circuit 100 via column decoder 300, in accordance with one embodiment of the present invention. MRAM 255 is coupled to node WL via row decoder 350. MRAM 255 is accessed when selected concurrently by column decoder 300 and row decoder 350. Column decoder 300 is responsive to address lines $A_1 \ldots A_K$ either directly as shown, or indirectly via one or more column predecoders (not shown). Similarly, row decoder 350 is responsive to address lines $A_{K+1} \ldots A_N$ either directly as shown or indirectly via one or more row predecoders (not shown). Write driver circuit 100 is shown in detail in FIG. 6 and described in detail above. MTJ 200 of MRAM 255 is shown as having a reference layer 12 that faces toward its associated select transistor 202.

Figure 9B:
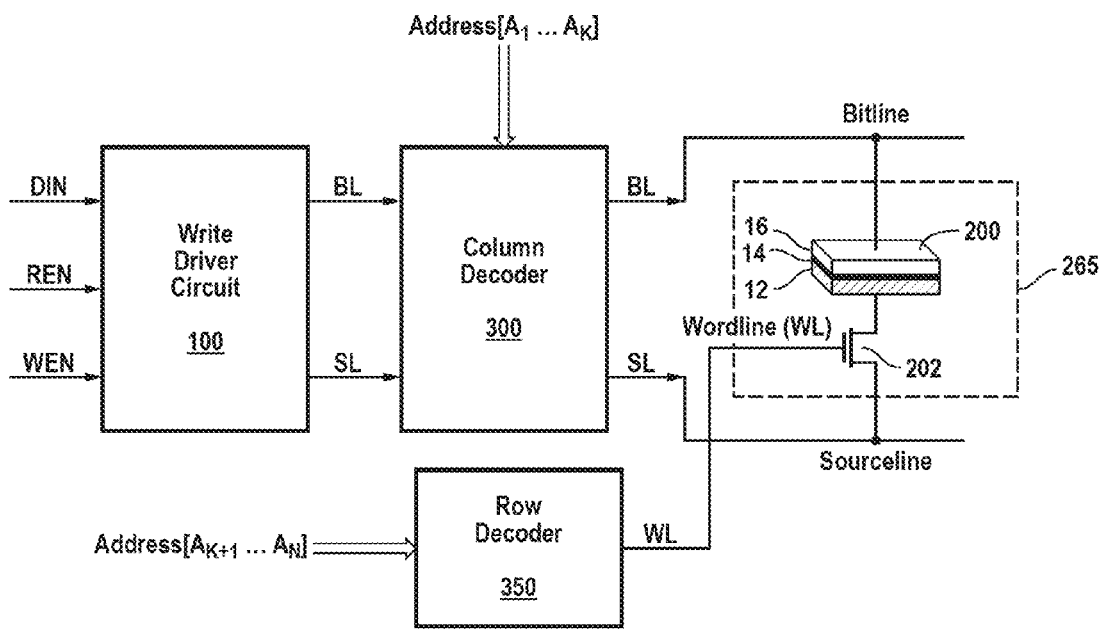
FIG. 9B shows a magnetic random access memory having a magnetic tunnel junction structure whose free layer faces its associated select transistor while coupled to the word driver circuit of FIG. 6, in accordance with one embodiment of the present invention.

FIG. 9B shows an MRAM 265 coupled to nodes BL and SL of write driver circuit 100 via column decoder 300, and to node WL via row decoder 350, in accordance with another embodiment of the present invention. MRAM 265 is similar to MRAM 255 and includes an MTJ 200 and an associated select transistor 202. However in MRAM 265, free layer 16 of MTJ 10 faces toward transistor 20 and its reference layer 12 faces away from transistor 20.

Figure 1A:
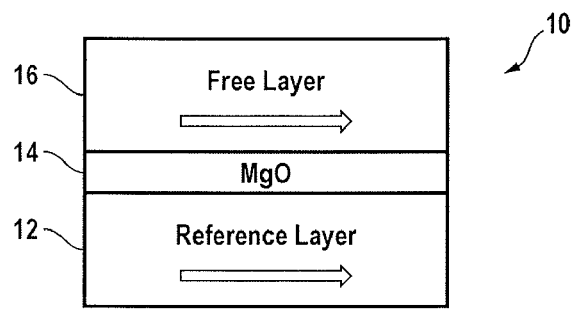
FIG. 1A is a simplified cross-sectional view of a magnetic tunnel junction structure of a magnetic random access memory cell when placed in a parallel magnetization state, as known in the prior art.
Figure 1B:
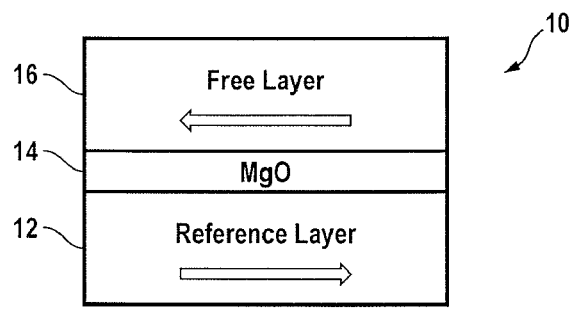
FIG. 1B shows the magnetic tunnel junction structure of FIG. 1A when placed in an anti-parallel magnetization state, as known in the prior art.
Figure 1C:
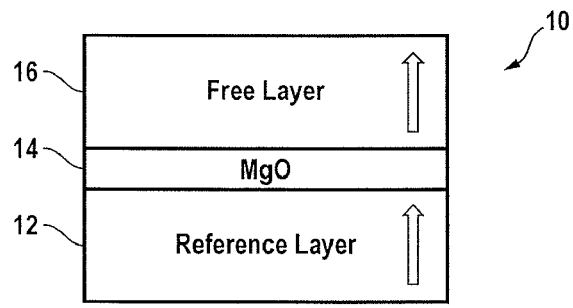
FIG. 1C is a simplified cross-sectional view of a magnetic tunnel junction structure of a magnetic random access memory cell when placed in a parallel magnetization state, as known in the prior art.
Figure 1D:
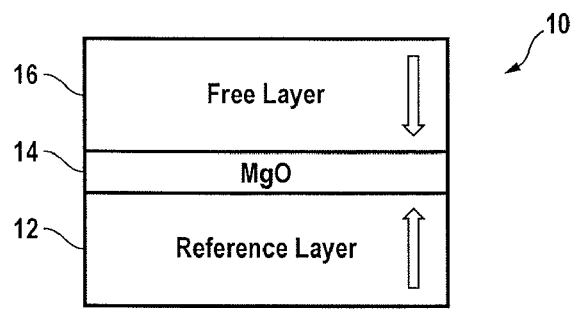
FIG. 1D shows the magnetic tunnel junction structure of FIG. 1D when placed in an anti-parallel magnetization state, as known in the prior art.
Figure 2A:
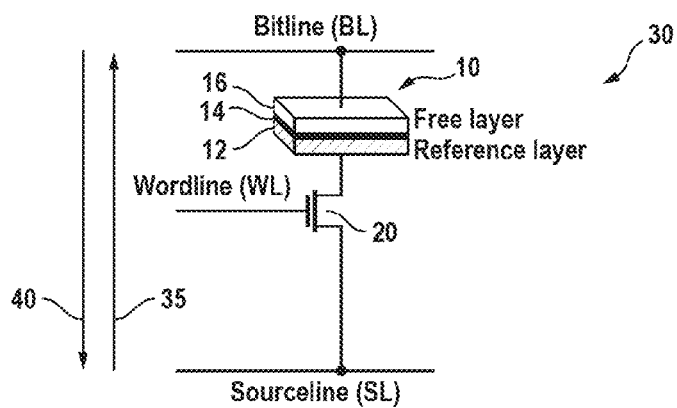
FIG. 2A shows a number of layers of a magnetic tunnel junction structure coupled to an associated select transistor, as known in the prior art.
Figure 2B:
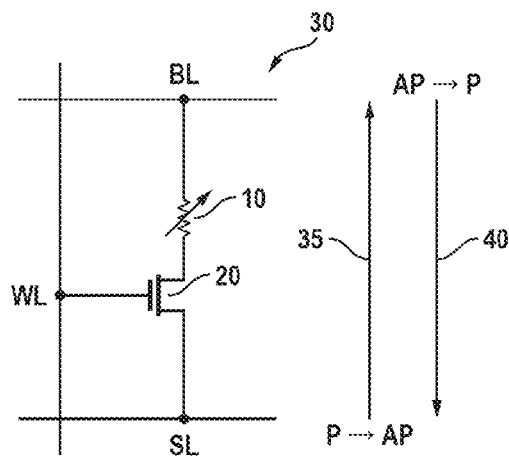
FIG. 2B is a schematic representation of the magnetic tunnel junction structure and its associated select transistor of FIG. 2A, as known in the prior art.
Figure 3:
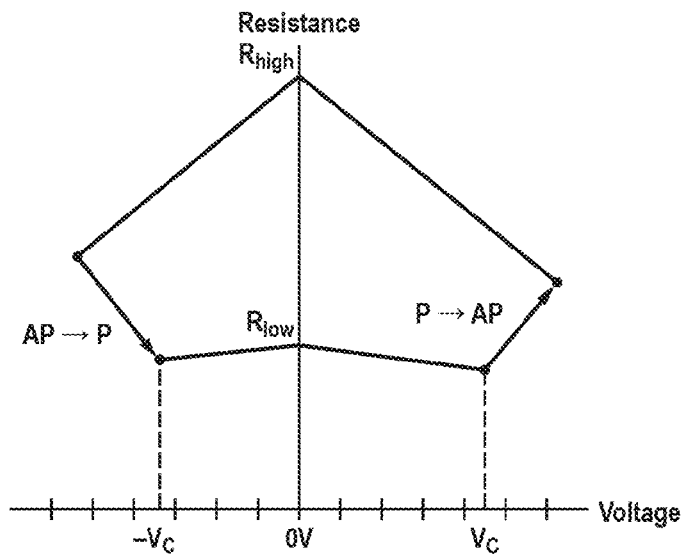
FIG. 3 shows the variation in the resistance of the magnetic tunnel junction structure of FIG. 2A in response to applied voltages, as known in the prior art.
Figure 4A:
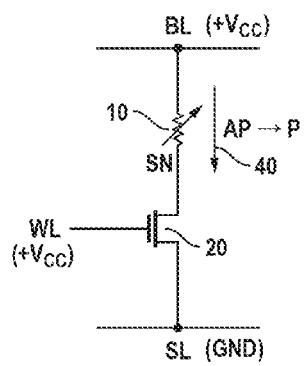
FIG. 4A shows a magnetic tunnel junction structure being programmed to switch from an anti-parallel state to a parallel state, as known in the prior art.
Figure 4B:
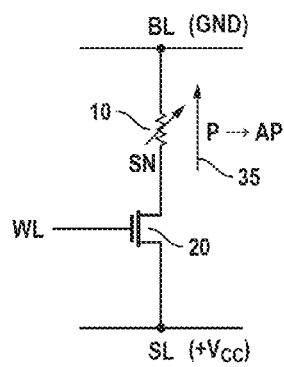
FIG. 4B shows a magnetic tunnel junction structure being programmed to switch from a parallel state to an anti-parallel state, as known in the prior art.
Figure 5:
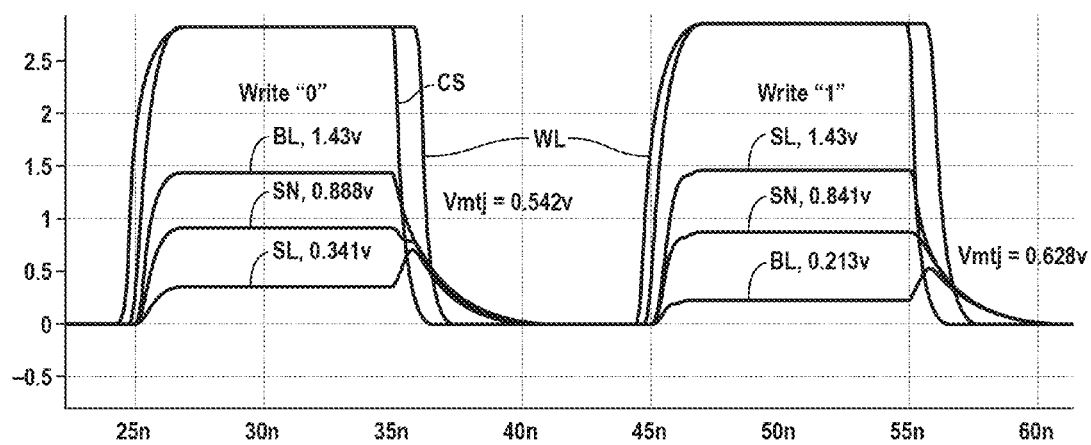
FIG. 5 is an exemplary timing diagram of a number of signals associated with a magnetic random access memory during write "0" and write "1" operations, as known in the prior art.
Figure 10:
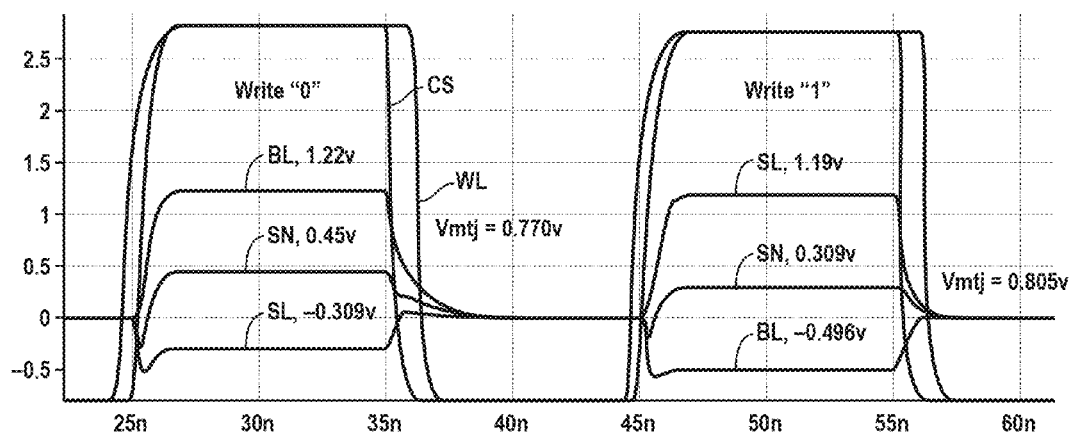
FIG. 10 is an exemplary timing diagram of a number of signals associated with a magnetic random access memory during write "0" and write "1" operations, in accordance with one embodiment of the present invention.

FIG. 10 is an exemplary timing diagram of the voltage levels at nodes WL, SL, SN and BL during write "0" and "1" operations for an MTJ in accordance with one embodiment of the present invention. Write "0" operation is shown as occurring approximately between times 25 ns and 35 ns. Write "1" operation is shown as occurring approximately between times 45 ns and 55 ns. Supply voltages $V_{CC}$ and Vbb are assumed to be 1.8 volts and −0.8 volts respectively. Signal WL as well as signal CS which is a column select signal are shown as having been boosted to a higher Vpp programming voltage of 3.0 volts. During the write "0" operation, the voltages at nodes BL, SL and SN are shown as being approximately equal to 1.22 V, −0.309 V, and 0.45V respectively. During the write "1" operation, the voltages at nodes BL, SL and SN are shown as being approximately equal to −0.496 V, 1.19 V, and 0.309 V respectively. Although not shown, for this exemplary computer simulation, the currents flowing through the MTJ during write "0" and "1" operations are respectively 184 μA and 158 μA. Comparing the simulation results associated with FIGS. 5 and 10, it is readily seen that the voltage across the MTJ is increased from 0.542 volts to 0.770 volts during a write "0" operation in accordance with the present invention. During a write "1" operation, the voltage across the MTJ is increased from 0.628 volts to 0.805 volts. Likewise, the exemplary MTJ associated with FIG. 10 has enhanced currents of 52% and 59% during write "0" and write "1" operations relative to the conventional MTJ associated with FIG. 5.

The above embodiments of the present invention are illustrative and not limitative. Various alternatives and equivalents are possible. The embodiments of the present invention are not limited by the type or the number of the magnetic random access memory cells used in a memory array. The embodiments of the present invention are not limited by the number of layers used to form a magnetic tunnel junction. The embodiments of the present invention are not limited by the voltage levels applied to the magnetic memory cells. Nor are the embodiments of the present invention limited by the write driver circuit being used to vary the terminal voltages of the select transistor during write cycles. The embodiments of the present invention are not limited by the type of transistor, PMOS, NMOS or otherwise, used to select a magnetic tunnel junction device. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture a magnetic random access memory. Other additions, subtractions or modifications are obvious in view of the present invention and are intended to fall within the scope of the appended claims.

What is claimed is:

1. A circuit comprising:
   a plurality of magnetic random access memory cells each comprising a magnetic tunnel junction structure and an associated select transistor;
   one or more column decoders;
   one or more row decoders;
   a write driver circuit responsive to a data signal and read/write signals, the write driver circuit adapted to:
      cause a first signal line coupled to a first one of the magnetic random access memory cells to be tristated, and to cause a second signal line coupled to the first one of the magnetic random access memory cell to be at a first voltage during a read operation;
      cause the first signal line to be at a second voltage and the second signal line to be at the first voltage during a first write operation, wherein said second voltage is greater than said first voltage; and
      cause the first signal line to be at a third voltage and the second signal line to be at the second voltage during a second write operation, wherein said third voltage is smaller than said first voltage.

2. The circuit of claim 1 wherein said write driver circuit further comprises a level sifter adapted to supply the third voltage in response to receiving the first voltage.

3. The circuit of claim 1 wherein said first write operation represents writing a "0" to the first one of the random access memory cells and wherein said second write operation represents writing a "1" to the first one of the random access memory cells.

4. The circuit of claim 1 wherein said first voltage is the ground voltage.

5. The circuit of claim 2 wherein said level shifter comprises:
   a first transistor having a gate terminal responsive to the data and write signals and a first current carrying terminal receiving the second voltage;
   a second transistor having a gate terminal responsive to the data and write signals and a first current carrying terminal receiving the second voltage;
   a third transistor having a gate terminal coupled to a second current carrying terminal of the second transistor, a first current carrying terminal coupled to a second current carrying terminal of the first transistor, and a third current carrying terminal receiving the third voltage; and
   a fourth transistor having a gate terminal coupled to the second current carrying terminal of the first transistor, a first current carrying terminal coupled to the second current carrying terminal of the second transistor, and a third current carrying terminal receiving the third voltage.

6. The circuit of claim 5 wherein said first write operation represents writing a "0" to the first one of the random access memory cells and wherein said second write operation represents writing a "1" to the first one of the random access memory cells, said driver circuit further comprising a fifth transistor adapted to be off during the read operation and the second write operation, and to supply the second voltage during the first write operation.

7. The circuit of claim 6 wherein said driver circuit further comprises a sixth transistor having a first current carrying terminal receiving coupled to the first signal lines, a second current carrying terminal receiving the second voltage, and a body terminal receiving the third voltage.

8. The circuit of claim 7 wherein said driver circuit further comprises a seventh transistor having a gate terminal receiving an output signal of the level shifter, a first current carrying terminal coupled to the first signal line, a second current carrying terminal receiving the third voltage, and a body terminal receiving the third voltage.

9. The circuit of claim 1 wherein a reference layer of the magnetic tunnel junction structure disposed in the first one of the magnetic random access memory cells faces its associated select transistor.

10. The circuit of claim 1 wherein a free layer of the magnetic tunnel junction structure disposed in the first one of the magnetic random access memory cells faces its associated select transistor.

11. A method of controlling operation of a plurality of magnetic random access memory cells each comprising a magnetic tunnel junction structure and an associated select transistor, the method comprising:
   selecting a first one of the magnetic random access memory cells;
   causing a first signal line coupled to the selected magnetic random access memory cell to be tristated during a read operation;
   causing a second signal line coupled to the selected magnetic random access memory cell to be at a first voltage during the read operation;
   causing the first signal line to be at a second voltage during a first write operation;
   causing the second signal line to be at the first voltage during the first write operation, wherein said second voltage is greater than the first voltage;
   causing the first signal line to be at a third voltage during a second write operation; and
   causing the second signal line to be at the second voltage during the second write operation, wherein said third voltage is smaller than said first voltage.

12. The method of claim 11 further comprising:
   supplying the third voltage in response to receiving the second voltage.

13. The method of claim 11 wherein said first write operation represents writing a "0" to the selected magnetic random access memory cell and wherein said second write operation represents writing a "1" to the selected magnetic random access memory cell.

14. The method of claim 11 wherein said first voltage is the ground voltage.

15. The method of claim 11 wherein supplying the third voltage in response to receiving the second voltage comprises:
   providing a first transistor having a gate terminal responsive to the data and write signals and a first current carrying terminal receiving the second voltage;
   providing a second transistor having a gate terminal responsive to the data and write signals and a first current carrying terminal receiving the second voltage;
   providing a third transistor having a gate terminal coupled to a second current carrying terminal of the second transistor, a first current carrying terminal coupled to a second current carrying terminal of the first transistor, and a third current carrying terminal receiving the third voltage; and providing a fourth transistor having a gate terminal coupled to the second current carrying terminal of the first transistor, a first current carrying terminal coupled to the second current carrying terminal of the second transistor, and a third current carrying terminal receiving the third voltage.

16. The method of claim 15 wherein said first write operation represents writing a "0" to the selected magnetic random access memory cell and wherein said second write operation represents writing a "1" to the selected magnetic random access memory cell, the method further comprising:

providing a fifth transistor adapted to be off during the read operation and the second write operation, and to supply the second voltage during the first write operation.

17. The method of claim 16 further comprising:

providing a sixth transistor having a first current carrying terminal coupled to a first current carrying terminal of the fifth transistor, a second current carrying terminal coupled to the first signal line, and a body terminal receiving the third voltage.

18. The method of claim 17 further comprising:

providing a seventh transistor having a gate terminal coupled to a second current carrying terminal of the second transistor, a first current carrying terminal coupled to the first signal line, a second current carrying terminal receiving the third voltage, and a body terminal receiving the third voltage.

19. The method of claim 11 wherein a reference layer of the magnetic tunnel junction structure disposed in the selected magnetic random access memory cell faces its associated select transistor.

20. The method of claim 11 wherein a free layer of the magnetic tunnel junction structure disposed in the selected magnetic random access memory cell faces its associated select transistor.

* * * * *

UNITED STATES PATENT AND TRADEMARK OFFICE
CERTIFICATE OF CORRECTION

| | | |
|---|---|---|
| PATENT NO. | : 8,077,508 B1 | Page 1 of 1 |
| APPLICATION NO. | : 12/544189 | |
| DATED | : December 13, 2011 | |
| INVENTOR(S) | : Adrian E. Ong | |

It is certified that error appears in the above-identified patent and that said Letters Patent is hereby corrected as shown below:

In column 1, line 3, insert the following paragraph before the first paragraph:

--GOVERNMENT RIGHTS
This invention was made with U.S. Government support under Grant/Contract No. H R0011-09-C-0023 awarded by DARPA. The U.S. Government retains certain rights in this invention. Distribution authorized to U.S. Government Agencies only.--

Signed and Sealed this
First Day of March, 2016

Michelle K. Lee
*Director of the United States Patent and Trademark Office*